United States Patent [19]

Manning

[11] Patent Number: 5,266,523
[45] Date of Patent: Nov. 30, 1993

[54] METHOD OF FORMING SELF-ALIGNED CONTACTS USING THE LOCAL OXIDATION OF SILICON

[75] Inventor: Monte Manning, Kuna, Id.

[73] Assignee: Micron Technology, Inc., Boise, Id.

[21] Appl. No.: 31,425

[22] Filed: Mar. 12, 1993

Related U.S. Application Data

[63] Continuation of Ser. No. 791,724, Nov. 14, 1991, abandoned.

[51] Int. Cl.⁵ .......................................... H01L 21/28
[52] U.S. Cl. .................................. 437/193; 437/968; 437/983; 437/984; 148/DIG. 117
[58] Field of Search ............... 437/69, 193, 968, 983, 437/984; 148/DIG. 117

[56] References Cited

U.S. PATENT DOCUMENTS

| | | | |
|---|---|---|---|
| 4,625,391 | 12/1986 | Sasaki | 148/DIG. 117 |
| 4,824,794 | 4/1989 | Tabata et al. | 148/DIG. 117 |
| 5,061,646 | 10/1991 | Sivan et al. | 437/984 |
| 5,114,872 | 5/1992 | Roselle et al. | 437/968 |

FOREIGN PATENT DOCUMENTS

| | | | |
|---|---|---|---|
| 0268472 | 5/1988 | European Pat. Off. | 437/984 |
| 57-63859 | 4/1982 | Japan | 437/983 |

*Primary Examiner*—Brian E. Hearn
*Assistant Examiner*—Laura M. Holtzman
*Attorney, Agent, or Firm*—David J. Paul

[57] ABSTRACT

Self-aligned contacts are formed between a first layer of material which can be oxidized, such as polycrystalline silicon (poly 1), and a second layer of material such as metal or polycrystalline silicon (poly 2). A patterned layer of material, such as nitride, that prevents the first layer from oxidizing is deposited over the poly 1 layer. The exposed poly 1 material is oxidized, while the poly 1 material covered by the nitride is protected from oxidation. The nitride is removed and another layer of conductive material is formed, and thus contacts the poly 1 layer which was protected from oxidation, while the oxide insulates the other poly 1 areas.

21 Claims, 4 Drawing Sheets

METHOD OF FORMING SELF-ALIGNED CONTACTS USING THE LOCAL OXIDATION OF SILICON

CROSS REFERENCE TO RELATED APPLICATION

This is a continuation of U.S. patent application Ser. No. 791,724 filed Nov. 14, 1991, now abandoned.

FIELD OF THE INVENTION

This invention relates to the field of semiconductor manufacturing. More specifically, a method of forming a self-aligned contact is described. The contact can be made between two polycrystalline silicon (poly) layers, or between any two layers as long as the material of the bottom layer can be oxidized.

BACKGROUND OF THE INVENTION

To manufacture a semiconductor device, an electronic circuit is chemically and physically integrated into a substrate such as a silicon wafer by patterning regions in the substrate, and by patterning layers on the substrate. These regions and layers can be conductive for conductor and resistor fabrication and can also be of differing conductivity types, which is essential for transistor and diode fabrication. Degrees of resistance, capacitance, or conductivity are controllable, as are the physical dimensions and locations of the patterned regions and layers, making circuit integration possible.

In this disclosure, "n-type" denotes silicon that has been doped with atoms having more than four valence electrons (group V or higher), such as arsenic or phosphorus, which introduce negatively charged majority carriers into the silicon, and "p-type" denotes silicon doped with atoms having less than four valence electrons (group III or lower), such as boron, which introduce positively charged majority carriers. The majority charge carrier type is also referred to as conductivity type. "Poly" denotes polycyrstalline silicon. "Poly 1" denotes a first poly layer but does not imply a second poly layer, and "Poly 2" denotes a second poly layer. By photomasking, geometries on the order of a micron or less are obtainable for device elements in the IC.

In the manufacture of semiconductors, several process steps are required to produce a functional die. A wafer of a starting material such as silicon or gallium arsenide is layered with oxide, poly, nitride, photoresist, and other materials in various configurations, depending on the type and design of the device which is being produced. Each step may require the local deposition, growth, or other formation of one of the above listed materials (patterning), or a blanket layer of the material may be laid down and a pattern etched away with chemicals or abraded away by particles.

During the fabrication of semiconductor devices using metal oxide semiconductor (MOS) technology, conductive interconnects (or contacts) between different layers or types of conductive material are required to form a circuit. For example, as a MOS transistor is formed in a silicon substrate's active area, its gate, formed from a first poly layer, has to be connected to other circuitry by a conductor, such as a second layer of poly.

Contacts between layers can comprise two types. In this disclosure, non self-aligned contacts refer to contacts formed by a process which has little or no tolerance for misalignment of masks, especially if the alignment cannot extend beyond the poly structure to which the mask is being aligned. If the mask is misaligned to a point that it extends beyond the edge of the poly structure, an etch or deposition of a material such as photoresist with the misaligned mask produces a device which does not function properly. A self-aligned process refers to a process which has a high tolerance for misalignment of a mask, especially if the mask can be aligned completely off the poly structure to which the mask is being aligned.

Many current methods of forming a contact between two conductive layers such as poly requires expanded dimensions of the poly 1 layer in the area of the contact. FIG. 1 is a top view of the poly 1 layer which shows a poly 1 line 10 with expanded dimensions 12. A first layer of poly 10 has been formed on the surface of the substrate (not shown), then a layer of insulator such as oxide (not shown) is formed on the first poly layer 10. An etch through a specific area 14 of the oxide allows a second layer of poly (not shown) formed thereon to contact the first poly layer 10. The expanded dimensions 12 of the bottom poly layer 10 allows for misalignment of the etch 14 through the oxide layer. Misalignment of the etch can result from misalignment of the photomask during the etch step. This is an example of a nonaligned process, because the edge of the mask cannot extend beyond the boundary of the poly 1 line without etching down into the substrate. After a misaligned etch, a poly 2 layer deposited over the etch into the substrate would allow the poly 2 layer to contact the substrate.

This method of forming a contact requires a greater amount of substrate surface space due to the increased size 12 of the poly 1 layer 10 in the contact area 14, thereby increasing the size of the device as many of these structures can be formed on the wafer surface. In cases where the etch mask is greatly misaligned, the etch can expose the substrate which can allow the poly 2 layer to make contact with the substrate, and may thereby produce a defective device.

A typical self-aligned process for forming poly 1 to poly 2 contacts to a MOS transistor is shown in the cross sections of FIGS. 2a–2c. As shown in FIG. 2a, a wafer substrate 20 is processed to have field oxide 22, gate oxide 24, a first layer of poly (poly 1) 26, and a patterned layer of photoresist 28. An etch patterns the poly 1 layer 26 to form a transistor gate 30 as shown in FIG. 2b. Next, oxide spacers 32 are formed to offset the transistor source 34 and drain 36 regions of the MOS device from the gate/channel region, and to protect the gate oxide 24 under the spacers 32 during later etching steps. An implant forms source 34 and drain 36 wells in the substrate 20. A method of implanting the source 34 and drain 36 regions is to perform a light implant before the spacers 32 are formed, and a heavier implant after the spacers 32 are formed, thus resulting in a double scalloped well as shown. This implantation method is known in the art, and is not critical to the invention. Other implant methods are known in the art and would work when used if the inventive process for contact formation is used. Another layer of oxide 38 is formed, and a second layer photoresist 40 is patterned over the oxide layer 38. The oxide 38 is etched away to selectively expose the poly 1 layer 26, which also removes material from the oxide spacers 32. The spacers 32 thereby prevent an etch through the gate oxide 24 which would allow the poly 2 layer 42 to contact the substrate 20. Finally, as shown in FIG. 2c, a second layer of poly (poly 2) 42 is patterned, thereby forming contacts at 44 between poly 1 26 and poly 2 42. This process is self-aligned because the photomask to deposit the photoresist can be misaligned over the edge of the poly 1 layer 26 to a degree equal to the width of the spacers 32. As long as the mask is misaligned no more than the width of the spacers 32, the oxide etch will not erode the gate oxide 24 to expose the substrate 20.

Other problems in addition to the possibility of photomask misalignment and increased poly 1 size described above also exist with this type of self-aligned process. For example, the oxide layer 38 formed over the poly 1 26 layer must have a controlled thickness. If the oxide 38 is too thick, then to remove the oxide over the poly 1 layer in the contact area requires such a long etch that the oxide spacers 32 are also etched away, which allows the gate oxide 24 to be etched through, which exposes the substrate 20. The subsequent poly 2 layer 42 would then make contact with the substrate 20, thereby producing a defective device. This process therefore requires larger spacers 32 than would normally be used in simple MOS devices. Typical MOS spacers may not be as large as the worst case misalignment, and this process would therefore require additional processing to build up the spacers.

A process which allows for self-alignment of the contacts independent of the spacer width would solve the problems associated with previous methods of contact formation.

SUMMARY OF THE INVENTION

An object of the invention is to provide a method of forming a self-aligned contact which allows for a much greater misalignment than previous self-aligned contacts which depend on the spacer width.

Another object of the invention is to provide a process of contact formation which does not require increased dimensions of a first polycrystalline silicon (poly 1) layer in the contact area due to its self-aligned characteristics. This results in more space on the surface of the wafer substrate.

Yet another object of the invention is to provide a self-aligned contact which has less exacting requirements to the thickness of the oxide formed over the poly 1 layer.

Still another object of the invention is to provide a method of self-aligned contacts which forms the transistor gate with the same etch that determines the contact area over the transistor, thereby providing a transistor gate contact which has no possibility of misalignment.

These objects of the invention are realized by an inventive method of forming contacts using a layer of nitride or other material to cover the poly 1 layer in the area of contact. Instead of forming a blanket layer of oxide and etching through it to expose the poly 1 layer in the contact area, the oxide is grown over the surface of the poly 1 layer except in those areas where the poly 1 to poly 2 contact is to be made, those areas having the nitride barrier to oxide growth. This allows for the formation of a contact that has no possibility of misalignment, as the nitride layer is etched at the same time the poly transistor gates are formed.

The invention can be used to produce a contact between two poly layers, a poly layer and a metal layer, or between layers of other material, as long as the bottom layer is capable of being oxidized.

DETAILED DESCRIPTION OF THE INVENTION

Figure 1:
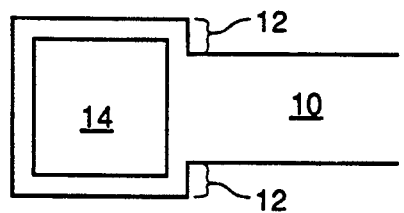
FIG. 1 is a top view of the expanded dimensions of a conventional polyol contact area.
Figure 2A:
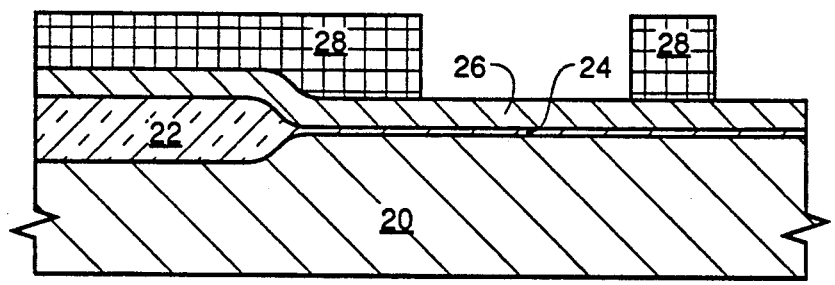
FIGS. 2a–2c show a conventional process for forming the contact of FIG. 1.
Figure 2B:
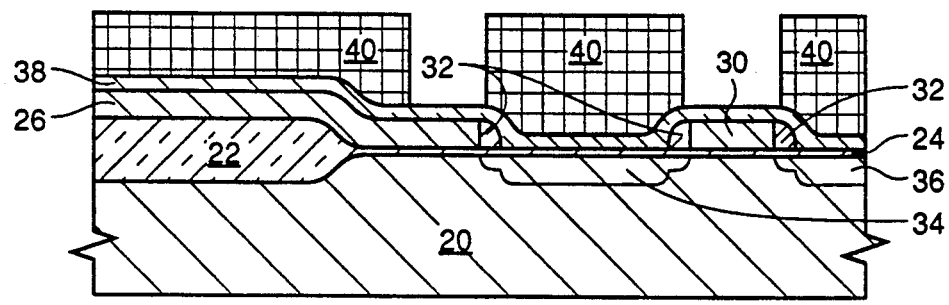
Figure 2C:
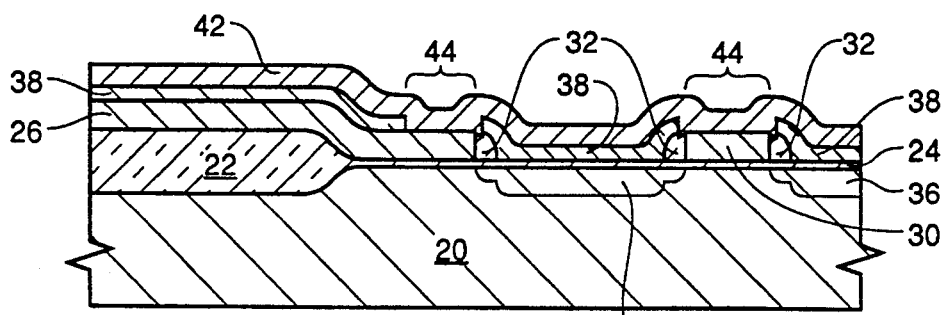
Figure 3A:
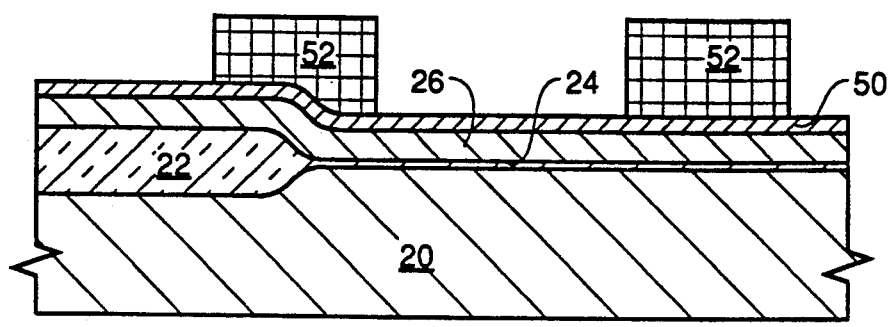
FIGS. 3a–3g show an inventive process for forming a self-aligned contact using spacers.

FIGS. 3a through 3g show a process comprising the invention. In FIG. 3a, a substrate 20 is shown having an oxide layer comprising field oxide 22 and gate oxide 24, a blanket first layer of polycrystalline silicon (poly 1) 26, and a blanket layer of nitride 50. The substrate 20 can be either p-type or n-type, and a poly 1 layer can also be p-type or n-type. The thicknesses of the layers of the various materials herein are in accordance with teachings in the art for semiconductor wafer manufacture, and are clearly understood by an artisan of skill in the art. A layer of photoresist 52 protects the nitride 50 in the areas where the contacts are to be formed. An etch removes the exposed nitride.

Figure 3B:
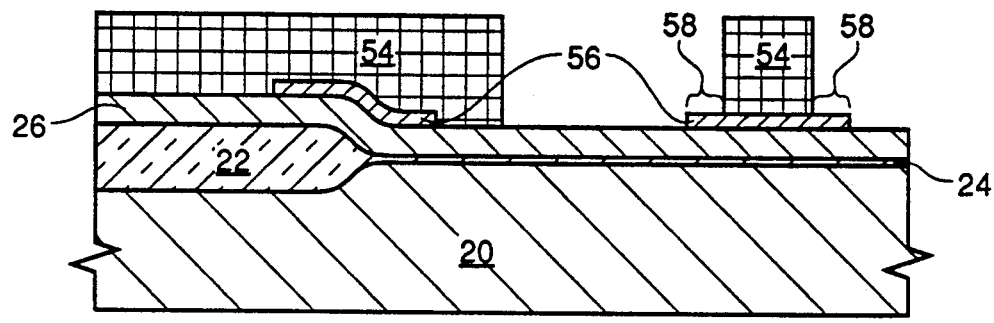

In FIG. 3b, a second photoresist layer 54 is deposited over the remaining nitride 56, over what will become the transistor gate, and over other areas of poly 1 26 which will not be etched. This is a noncritical mask step with regard to the contact, as the photoresist 54 over the transistor gate area can contain some allowance 58 for misalignment of the photoresist 54 as shown. The structure of FIG. 3c remains after an etch. During this etch, the transistor gate 30 of poly 1 material is formed having a nitride cap 60, the nitride cap 60 and other remaining nitride areas 56 determining the contact areas. The simultaneous formation of the transistor gate 30 and nitride cap 60 thereon produces a transistor gate contact which has no possibility of misalignment. The nitride cap 60 and the gate 30 are therefore self-aligned, while other parts of layers 56 and 26 as shown in FIG. 3c may not be self-aligned, depending on each individual use of the invention with a particular structure formation.

Figure 3C:
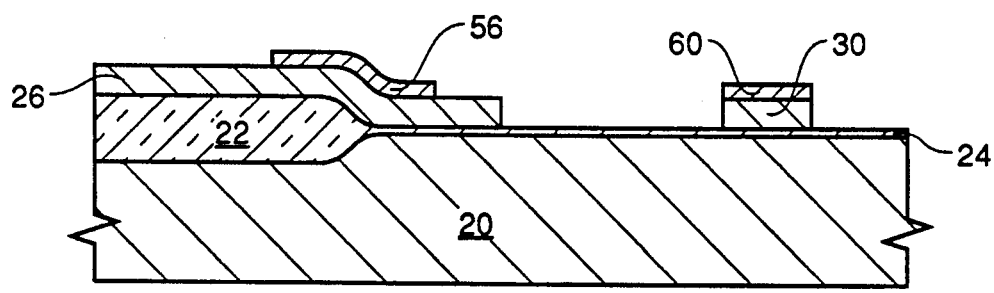
Figure 3D:
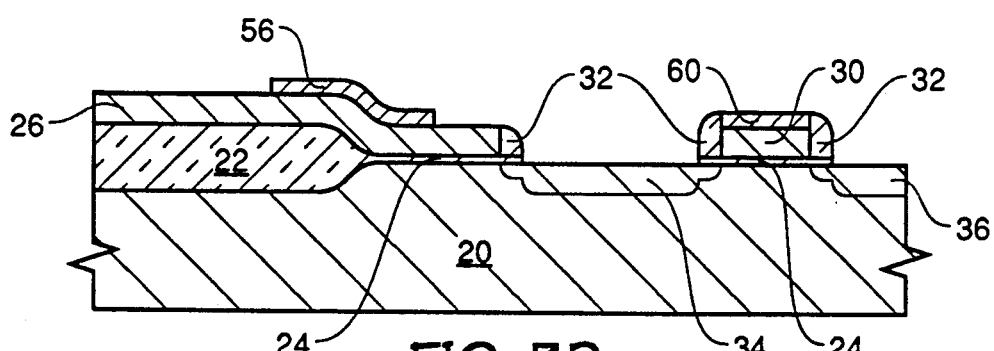

FIG. 3d shows the FIG. 3c structure after the implant to form the source 34 and drain 36 regions in the substrate 20, and after the formation of oxide spacers 32. These spacers 32 are optional, and the inventive process with the spacers omitted is described in FIGS. 4a and 4b. During spacer 32 formation, the exposed gate oxide 24 is removed to the substrate 20.

Figure 3E:
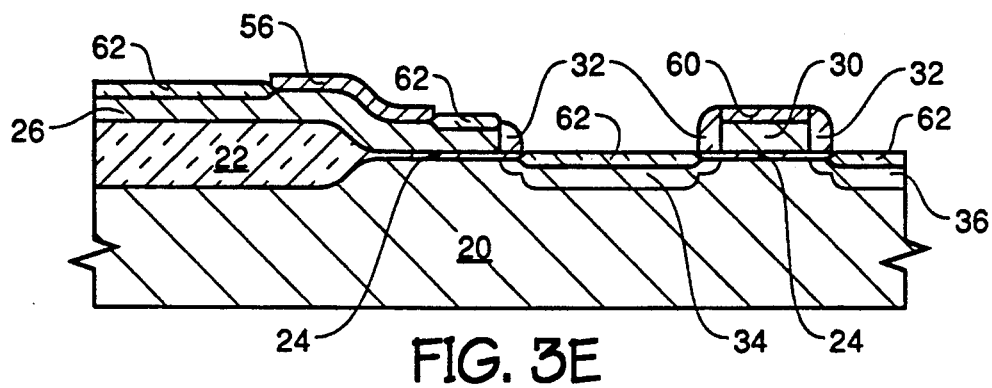

As shown in FIG. 3e, the exposed areas of the poly 1 layer 26 are oxidized. The "thermal oxide" 62 grows on the exposed substrate 20 in the areas over the transistor source 34 and drain 36, and on the exposed poly 1 surface. The thermal oxide does not form on the areas protected by the nitride 56, 60, which are the area where the contacts will be made to the poly 1 layer 26.

Figure 3F:
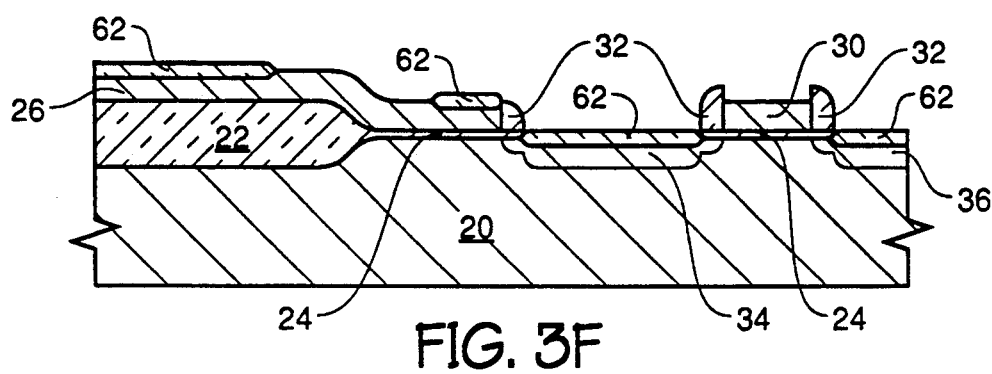
Figure 3G:
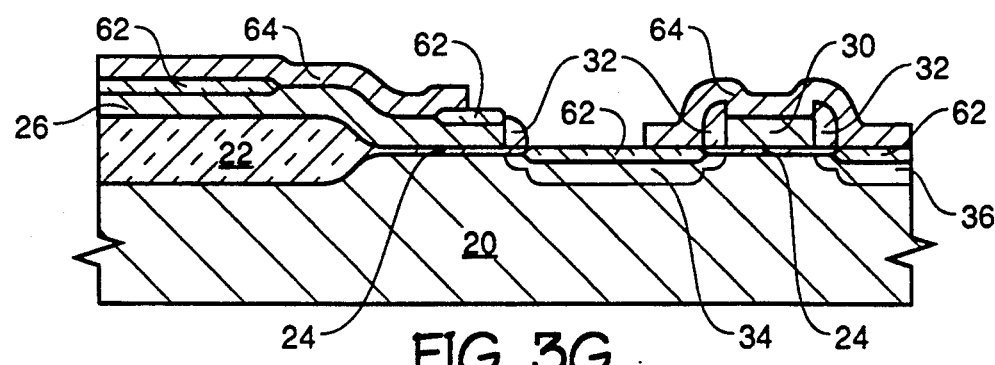

Referring to FIG. 3f, after the thermal oxide 62 is grown the nitride 56, 60 is stripped to expose the poly 1 layer 26, 30 in the contact areas. A final patterned layer of poly 2 64 is formed as shown in FIG. 3g, which contacts the poly 1 layer 26, 30 in the exposed areas. Wafer processing continues in accordance with teachings in the art.

Figure 4A:
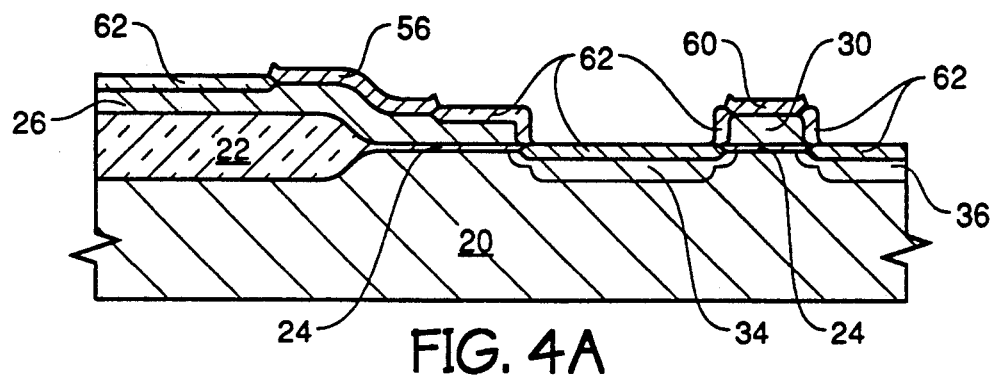
FIGS. 4a and 4b show an inventive process for forming a self-aligned contact omitting the spacers of FIG. 3.
Figure 4B:
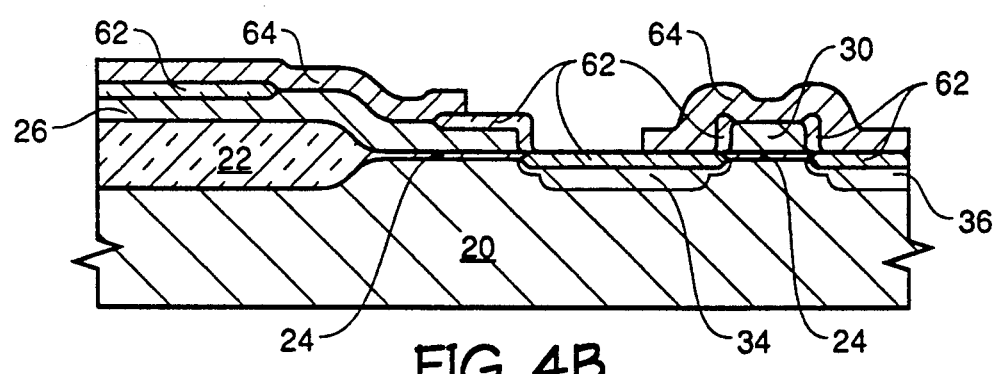

FIGS. 4a–4b show the inventive process omitting the oxide spacers. Since the ends of the poly 1 layer 26 are insulated by thermal oxide 62 which forms thereon, there is no need for the spacers. The spacers are not required to protect the gate oxide during the oxide etch step, since no oxide etch is required to expose the poly 1. The poly 1 is instead exposed by stripping the nitride. Starting with the structure of 3c, a light implant is performed to define the source 34 and drain 36 regions, then thermal oxide 62 is formed. Another heavier implant to further define the source 34 and drain 36 is performed through the thermal oxide 62, thereby leaving the structure of FIG. 4a. A patterned layer of poly 2 64, as shown in FIG. 4b, is formed on the wafer surface. Wafer processing continues in accordance with teachings in the art.

What have been described are specific configurations of the invention, as applied to particular embodiments. Clearly, variations can be made to the original design described in this document for adapting the invention to other embodiments while maintaining the spirit of the invention. For example, various poly thicknesses and compositions may be used without changing the scope and intent of the invention. Additionally, other intermediate layers can be added while maintaining the intent of the invention. The invention can be used with other higher layers of poly, for instance poly 3 to poly 4 contacts, or with contacts between layers of other materials. Finally, implants other than the ones described above may be used with the inventive process for contact formation, or the implants can be performed in a different order than described above. Therefore, the invention should be read as limited only by the appended claims.

I claim:

1. A method of forming contact areas on the surface of a wafer of semiconductor material, comprising the steps of:
   a) forming a blanket first conductive layer over said wafer surface, said first conductive layer being oxidizable;
   b) forming a protective layer over said first conductive layer, said protective layer preventing oxidation of said first conductive layer thereunder;
   c) forming a first patterned photoresist layer over said protective layer, said photoresist covering portions of said protective layer and leaving portions of said protective layer exposed;
   d) removing said exposed portions of said protective layer and leaving said blanket conductive layer substantially intact;
   e) forming a second patterned photoresist layer over portions of said first conductive layer and over portions of said protective layer;
   f) etching through said protective layer and said blanket first conductive layer such that said first conductive layer becomes patterned thereby and at least part of said conductive and protective layers are self-aligned;
   g) oxidizing said exposed portions of said first conductive layer, said first conductive layer comprising oxidized and unoxidized regions thereby said oxidized areas being insulative;
   h) removing said protective layer; and
   i) forming a second conductive layer over said first conductive layer such that said second conductive layer contacts said oxidized and unoxidized portions of said first conductive layer,
   wherein an electrical impulse can be transferred between said first and second conductive layers through said unoxidized portions of said first conductive layer.

2. The method of claim 1 wherein said first conductive layer comprises polycrystalline silicon having a first type conductivity.

3. The method of claim 2 wherein said first type conductivity comprises n-type.

4. The method of claim 2 wherein said first type conductivity comprises p-type.

5. The method of claim 1 wherein said protective layer comprises nitride.

6. The method of claim 1 wherein said second conductive layer comprises polycrystalline silicon having a second type conductivity.

7. The method of claim 6 wherein said second type conductivity comprises n-type.

8. The method of claim 6 wherein said second type conductivity comprises p-type.

9. The method of claim 1 wherein said second conductive layer comprises metal.

10. The method of claim 1 wherein said first conductive layer comprises substantially vertical edges, said method further comprising the step of forming spacers at said vertical edges before said oxidizing step.

11. The method of claim 1 wherein said oxidizing step forms thermal oxide on said first conductive layer.

12. A method of forming contact areas on the surface of a wafer of semiconductor material, comprising the steps of:
   a) forming a blanket first conductive layer comprising polycrystalline silicon having a first type conductivity over said water surface;
   b) forming a protective layer comprising nitride over said first conductive layer;
   c) forming a first patterned photoresist layer over said protective layer, said photoresist covering portions of said protective layer and leaving portions of said protective layer exposed;
   d) removing said exposed portions of said protective layer and leaving said first conductive layer substantially intact;
   e) forming a second patterned photoresist layer over portions of said blanket first conductive layer and over portions of said protective layer;
   f) etching through said blanket first conductive layer and said protective layer such that at least part of said conductive and protective layers are self-aligned, said etch patterning said first conductive layer;
   g) oxidizing said exposed portions of said first conductive layer, said first conductive layer comprising oxidized and unoxidized regions thereby;
   h) removing said protective layer; and
   i) forming a second conductive layer over said first conductive layer such that said second conductive layer contacts said oxidized and unoxidized portions of said first conductive layer,
   wherein an electrical impulse can be transferred between said first and second conductive layers through said unoxidized portions of said first conductive layer.

13. The method of claim 2 wherein said first type conductivity comprises n-type.

14. The method of claim 12 wherein said first type conductivity comprises p-type.

15. The method of claim 12 wherein said second conductive layer comprises polycrystalline silicon.

16. The method of claim 12 wherein said second conductive layer comprises metal.

17. The method of claim 12 wherein said first conductive layer comprises substantially vertical edges, said method further comprising the step of forming spacers at said vertical edges before said oxidizing step.

18. The method of claim 12 wherein said oxidizing step forms thermal oxide on said first conductive layer.

19. A method of forming contact areas on the surface of a wafer of semiconductor material, comprising the steps of:
   a) forming an unpatterned first conductive layer over said wafer surface;
   b) forming a patterned protective layer over said first conductive layer;
   c) forming a patterned photoresist layer over portions of said first conductive layer and over portions of said protective layer;
   d) etching through said unpatterned first conductive layer and said protective layer, said first conductive layer being patterned thereby, said etching resulting in at least a partial self-alignment of said first conductive and protective layers;
   e) oxidizing exposed portions of said first conductive layer, said first conductive layer comprising oxidized and unoxidized regions thereby;
   f) removing said protective layer; and
   g) forming a second conductive layer over said first conductive layer such that said second conductive layer contacts said oxidized and unoxidized portions of said first conductive layer,
   wherein an electrical impulse can be transferred between said first and second conductive layers through said unoxidized portions of said first conductive layer.

20. The method of claim 19 wherein said first and second conductive layers comprise polycrystalline silicon.

21. The method of claim 19 wherein said second conductive layer comprises a metal.

* * * * *